United States Patent
Oyama et al.

(10) Patent No.: US 11,079,730 B2
(45) Date of Patent: Aug. 3, 2021

(54) CONTROL DEVICE COMPRISING A PROCESSOR AND AN IC

(71) Applicant: HITACHI AUTOMOTIVE SYSTEMS, LTD., Ibaraki (JP)

(72) Inventors: Katsuya Oyama, Hitachinaka (JP); Mitsuhiko Watanabe, Hitachinaka (JP); Takeshi Konno, Hitachinaka (JP); Yasushi Sugiyama, Hitachinaka (JP); Chihiro Sato, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 259 days.

(21) Appl. No.: 16/464,675

(22) PCT Filed: Oct. 24, 2017

(86) PCT No.: PCT/JP2017/038336
§ 371 (c)(1),
(2) Date: May 28, 2019

(87) PCT Pub. No.: WO2018/105257
PCT Pub. Date: Jun. 14, 2018

(65) Prior Publication Data
US 2019/0294134 A1 Sep. 26, 2019

(30) Foreign Application Priority Data
Dec. 5, 2016 (JP) .............................. JP2016-235843

(51) Int. Cl.
*B60L 15/32* (2006.01)
*H04L 7/02* (2006.01)
(Continued)

(52) U.S. Cl.
CPC ............ *G05B 19/042* (2013.01); *B60R 16/02* (2013.01); *B60R 16/0231* (2013.01);
(Continued)

(58) Field of Classification Search
None
See application file for complete search history.

(56) References Cited

U.S. PATENT DOCUMENTS 7,263,416 B2 * 8/2007 Sakurai ................. G06F 1/3215
701/22
7,680,228 B2 * 3/2010 Kanekawa .......... G06F 13/4291
375/359

(Continued)

FOREIGN PATENT DOCUMENTS

JP 54-147766 A 11/1979
JP 2004-339977 A 12/2004
(Continued)

OTHER PUBLICATIONS

International Search Report for PCT/JP2017/038336, dated Dec. 19, 2017.

*Primary Examiner* — Kenneth B Wells
(74) *Attorney, Agent, or Firm* — Volpe Koenig

(57) ABSTRACT

The present disclosure provides a control device having versatility and extensibility of a load driving circuit. A control device includes a processor and an IC, in which the IC includes: a communication circuit that transmits a control signal from the processor; a first drive circuit that drives a first load; a second drive circuit that drives a second load and is provided outside the IC separately from the first drive circuit; and a third drive circuit that controls the second drive circuit, the processor transmits channel information corresponding to the number of switches of the second drive circuit to the IC, and the communication circuit changes the number of channels of the third drive circuit on the basis of the channel information.

11 Claims, 9 Drawing Sheets

(51) Int. Cl.

| | |
|---|---|
| *F02D 41/26* | (2006.01) |
| *F02D 41/28* | (2006.01) |
| *G05B 19/042* | (2006.01) |
| *B60R 16/023* | (2006.01) |
| *H03K 17/08* | (2006.01) |
| *H03K 17/687* | (2006.01) |
| *B60R 16/02* | (2006.01) |
| *F02D 45/00* | (2006.01) |

(52) U.S. Cl.
 CPC ........... *H03K 17/08* (2013.01); *H03K 17/687* (2013.01); *F02D 45/00* (2013.01)

(56) References Cited

U.S. PATENT DOCUMENTS

| | | | |
|---|---|---|---|
| 8,165,743 B2 * | 4/2012 | Oyama | ................... B60L 50/61 |
| | | | 701/29.2 |
| 9,719,481 B2 * | 8/2017 | Oyama | ................ F02D 41/266 |
| 2004/0230347 A1 | 11/2004 | Sakurai et al. | |
| 2009/0184576 A1 | 7/2009 | Oura et al. | |

FOREIGN PATENT DOCUMENTS

| | | |
|---|---|---|
| JP | 2006-220039 A | 8/2006 |
| JP | 2009-177319 A | 8/2009 |
| JP | 5848230 B2 | 1/2016 |
| JP | 2016-186309 A | 10/2016 |

\* cited by examiner

FIG. 2
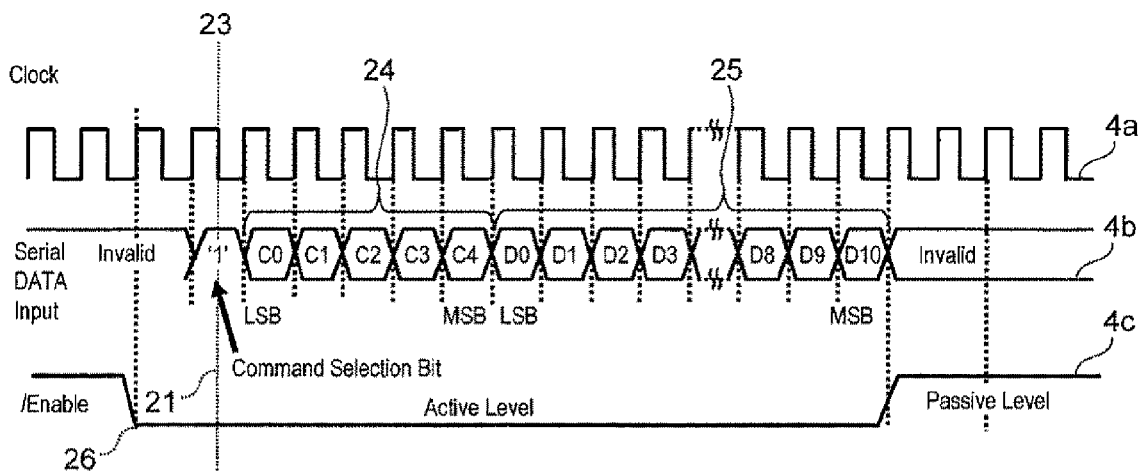
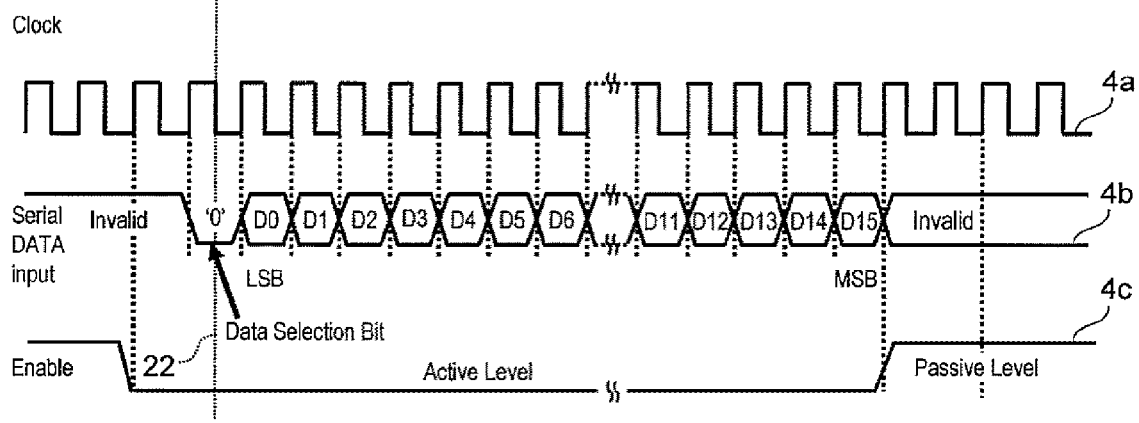

FIG. 3

DATA FRAME

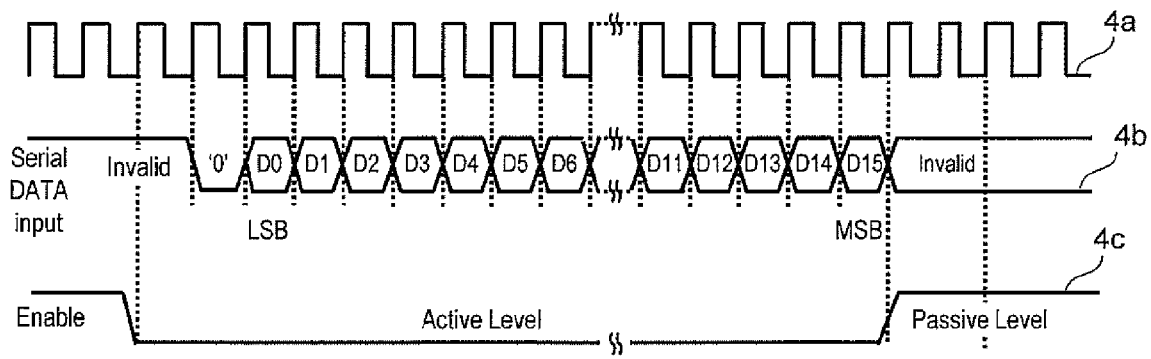

| bit | DRIVE CIRCUIT | bit 0 | bit 1 |
|---|---|---|---|
| D0 | INJECTOR DRIVER 1 | OFF | ON |
| D1 | INJECTOR DRIVER 2 | OFF | ON |
| D2 | INJECTOR DRIVER 3 | OFF | ON |
| D3 | INJECTOR DRIVER 4 | OFF | ON |
| D4 | IGNITER PRE-DRIVER 1 | OFF | ON |
| D5 | IGNITER PRE-DRIVER 2 | OFF | ON |
| D6 | IGNITER PRE-DRIVER 3 | OFF | ON |
| D7 | IGNITER PRE-DRIVER 4 | OFF | ON |
| D8 | FLEXIBLE DRIVER 1 | OFF | ON |
| D9 | FLEXIBLE DRIVER 2 | OFF | ON |
| D10 | FLEXIBLE DRIVER 3 | OFF | ON |
| D11 | FLEXIBLE DRIVER 4 | OFF | ON |
| D12 | FLEXIBLE DRIVER 5 | OFF | ON |
| D13 | FLEXIBLE DRIVER 6 | OFF | ON |
| D14 | FLEXIBLE DRIVER 7 | OFF | ON |
| D15 | FLEXIBLE DRIVER 8 | OFF | ON |

| bit | DRIVE CIRCUIT | bit 0 | bit 1 |
|---|---|---|---|
| D0 | INJECTOR DRIVER 1 | OFF | ON |
| D1 | INJECTOR DRIVER 2 | OFF | ON |
| D2 | INJECTOR DRIVER 3 | OFF | ON |
| D3 | INJECTOR DRIVER 4 | OFF | ON |
| D4 | IGNITER PRE-DRIVER 1 | OFF | ON |
| D5 | IGNITER PRE-DRIVER 2 | OFF | ON |
| D6 | IGNITER PRE-DRIVER 3 | OFF | ON |
| D7 | IGNITER PRE-DRIVER 4 | OFF | ON |

CONTROL DEVICE COMPRISING A PROCESSOR AND AN IC

TECHNICAL FIELD

The present invention relates to a control device.

BACKGROUND ART

In order to improve internal signal transmission efficiency in a control device that drives a load, a system of transmitting a control signal from a processor to a drive circuit including a switching element using serial communication has been proposed. For example, PTL 1 discloses an example of this system.

CITATION LIST

Patent Literature

PTL 1: JP 5848230 B2

SUMMARY OF INVENTION

Technical Problem

A control device that drives a load is required to have a function to flexibly change the number of drive circuits and specifications of the drive circuits in accordance with the increase and decrease of the load. However, in the device of PTL 1, the number of load driving circuits and specifications of the load driving circuits are fixed, and no consideration is given to versatility and extensibility of the load driving circuit.

Therefore, the present disclosure provides a control device having versatility and extensibility of a load driving circuit.

Solution to Problem

For example, in order to solve the above problem, the configuration described in the claims is adopted. The present application includes a plurality of means for solving the above problems. As an example of the means, provided is a control device including a processor and an IC, in which the IC includes: a communication circuit that transmits a control signal from the processor by serial communication; a first drive circuit that drives a first load; a second drive circuit that drives a second load and is provided outside the IC separately from the first drive circuit; and a third drive circuit that controls the second drive circuit, the processor transmits channel information corresponding to the number of switches of the second drive circuit to the IC, and the communication circuit changes the number of channels of the third drive circuit on the basis of the channel information.

Advantageous Effects of Invention

According to the present invention, it is possible to provide a control device having versatility and extensibility of a load driving circuit. Further features related to the present invention will become apparent from the description of this specification and the accompanying drawings. The problems, configurations, and effects other than those described above will be clarified from the description of the embodiments below.

BRIEF DESCRIPTION OF DRAWINGS

FIG. 2 is a diagram for explaining a command frame and a data frame in the first embodiment.

FIG. 3 is a diagram showing allocation of a data frame and a drive circuit in the first embodiment.

DESCRIPTION OF EMBODIMENTS

Figure 1:
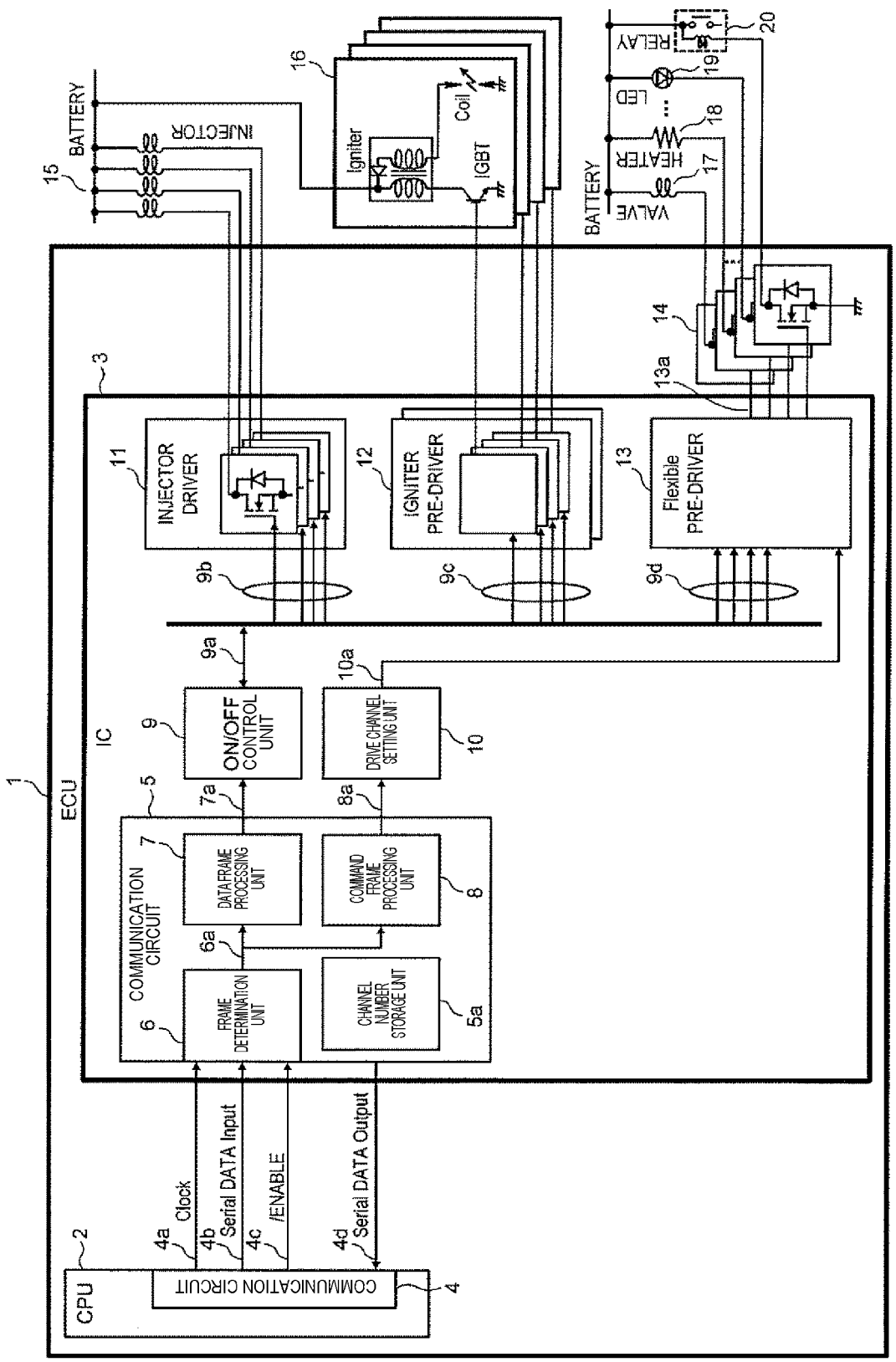
FIG. 1 is a configuration diagram of an engine control unit in a first embodiment.

Embodiments of the present invention will be described below with reference to the drawings. The accompanying drawings illustrate specific embodiments consistent with the principles of the invention, which are for the purpose of understanding the present invention and are not to be construed as limiting the invention in any way. In addition, the same elements are denoted y same reference numerals, and redundant explanations are omitted.

First Embodiment

FIG. 1 shows an engine control unit (hereinafter, referred to as "ECU") 1 as an example of a control device that drives a load such as a fuel injection valve. The ECU 1 controls an injector, an igniter, and various loads of a four-cylinder gasoline engine to drive. Note that the ECU 1 can drive not only a four-cylinder gasoline engine, but also a load such as a gasoline engine of another number of cylinders or a diesel engine of an arbitrary cylinder, for example. FIG. 1 is a diagram describing in detail a CPU 2 and a load driving IC 3 serving as a core of the present embodiment.

The ECU 1 includes the CPU (processor) 2, the load driving IC 3, and an external switching element 14 set outside the load driving IC 3. The CPU 2 generates timings for driving an injector 15, an igniter 16, various loads (a valve 17, a heater resistor 18, an LED 19, a relay 20) or the like. The load driving IC 3 drives the injector 15, the igniter 16, and the various loads 17 to 20.

In accordance with a control program stored in a non-volatile memory such as a flash memory, the CPU 2 outputs a control signal to the load driving IC 3, at the timing of driving the injector 15, the igniter 16, and the various loads to 20, for example, according to the operating state of a vehicle. Therefore, the CPU 2 includes a communication circuit 4 that transmits and receives various signals to and from the load driving IC 3 by serial communication.

The load driving IC 3 includes a communication circuit 5 that transmits and receives various signals to and from the CPU by serial communication. The load driving IC 3 further includes an ON/OFF control unit 9, a drive channel setting unit 10, an injector driver 11, an igniter pre-driver 12, and a flexible pre-driver 13.

The communication circuit 5 can receive channel information corresponding to the number of switches of a drive circuit to be controlled from the CPU 2 to change the number of channels of the drive circuit to be controlled on the basis of the channel information. For this purpose, the communication circuit 5 includes a frame determination unit 6, a data frame processing unit 7, a command frame processing unit 8, and a channel number storage unit 5a.

The frame determination unit 6 determines two communication frames, that is, a data frame and a command frame. The data frame is a frame for controlling (i) the injector driver 11 that controls the injector 15 that determines the amount of fuel supplied into an engine cylinder to drive, (ii) an igniter pre-driver 12 that controls the igniter 16 that determines ignition timing and ignition energy to drive, and (iii) ON/OFF of the flexible pre-driver 13 that controls engine accessories (the valve 17, the heater resistor 18, the LED 19, the relay 20) to drive via the external switching element 14. The command frame is a frame for setting the flexible pre-driver 13 or the like. The flexible pre-driver 13 controls ON/OFF of the external switching element 14 by the control signal 13a.

The data frame processing unit 7 executes processing when the communication frame received from the CPU 2 is a data frame. The command frame processing unit 8 executes processing when the communication frame received from the CPU 2 is a command frame.

The channel number storage unit 5a is a volatile memory and may include, for example, a register in the load driving IC 3. The channel number storage unit 5a stores the number of channels of the drive circuit. The channel number storage unit 5a stores the number of channels of the drive circuit determined by switching processing of the number of channels at the time of power supply activation of the ECU 1 (initialization processing in FIG. 4).

According to this configuration, since the external switching element 14 of a function extension unit is provided outside the load driving IC 3 and the flexible pre-driver 13 is built in the load driving IC 3, the load driving IC 3 in which the function extensibility and the IC chip size optimization are achieved can be provided.

When the frame determination unit 6 determines that the communication frame transmitted from the CPU 2 is a data frame, the frame determination unit 6 outputs communication frame information 6a to the data frame processing unit 7. Next, the data frame processing unit 7 performs discrimination processing on the communication frame information 6a, and inputs processing data 7a to the ON/OFF control unit 9. The ON/OFF control unit 9 outputs control signals 9a, 9b, 9c, 9d for controlling ON/OFF of the injector driver 11, the igniter pre-driver 12, and the flexible pre-driver 13 on the basis of the processing data 7a.

When the frame determination unit 6 determines that the communication frame transmitted from the CPU 2 is a command frame, the frame determination unit 6 outputs a communication frame information 6a to the command frame processing unit 8. The command frame processing unit 8 processes the communication frame information 6a and inputs outputs processing data 8a to the drive channel setting unit 10. The drive channel setting unit 10 outputs a control signal 10a for controlling validity/invalidity of the flexible pre-driver 13 on the basis of the processing data 8a.

According to this configuration, the CPU 2 can control the validity/invalidity of the function in the load driving IC 3. Therefore, even with different vehicle models, the function of the load driving IC 3 can be freely selected by software. According to this configuration, it is possible to improve versatility and function extensibility of the load driving IC 3. When invalidity of the function is set, the number of channels (bit length) to be controlled to drive by the load driving IC 3 can be reduced, and the bit length of the data frame to be ON/OFF controlled can be compressed short.

The transmission or reception signal between the CPU 2 and the load driving IC 3 is composed of a four-wire system of Clock (4a), Serial DATA Input (4b), /Enable (4c), and Serial DATA Output (4d). Here, Clock (4a), Serial DATA Input (4b), and /Enable (4c) are control signals from the CPU 2, and Serial DATA Output (4d) is a transmission signal from the load driving IC 3. In this way, the CPU 2 and the load driving IC 3 are configured to be capable of bidirectional communication.

FIG. 2 is a diagram for explaining a command frame and a data frame in communication. The command frame is a communication signal from the CPU 2 to the load driving IC 3, and is a frame indicating whether or not to use the flexible pre-driver 13 of the load driving IC 3 and the external switching element 14. The data frame is a frame for controlling ON/OFF of the injector driver 11, the igniter pre-driver 12, and the external switching element 14 set outside the load driving IC 3.

In the load driving IC 3, the frame determination unit 6 determines whether the received frame is a command frame or a data frame. The timing when the/Enable signal (4c) changes from "1" to "0" and the communication reception of the load driving IC 3 is enabled is indicated by 26. When the Serial DATA Input signal (4b) at the second falling edge of the Clock signal (4a) from the timing 26 (timing 23) is "1" (code 21), it is determined as a command frame. On the other hand, when the Serial DATA Input signal (4b) at the second falling edge of the Clock signal (4a) from the timing 26 (timing 23) is "0" (code 22), it is determined as a data frame. According to this configuration, the frame determination unit 6 can identify two communication frames (a command frame and a data frame) by the first one bit of a signal received from the CPU 2 every predetermined time.

The command frame includes addresses and data. In the example of FIG. 2, C0 to C4 (24) are addresses, and D0 to D10 (25) are data. For example, in a case of D5 bit=0 of D0 to D10 (25) at the address of C0 to C4 (24)=00001, the number of channels of the drive circuit is set such that the flexible pre-driver 13 and the external switching element 14 are not used. On the other hand, in a case of D5 bit=1 of D0 to D10 (25) at the same address, the number of channels of the drive circuit is set such that the flexible pre-driver 13 and the external switching element 14 are used.

FIG. 3 is a diagram showing allocation of a data frame and a drive circuit. In the data frame, each bit is configured to directly control ON/OFF of each load driving circuit. In this example, D0 to D3 are bits for controlling a channel 1 to a channel 4 of the injector driver 11, D4 to D7 are bits for controlling a channel 1 to a channel 4 of the igniter pre-driver 12, and D8 to D15 are bits for controlling a channel 1 to a channel 8 of the flexible pre-driver 13 and the external switching element 14. For each bit, for example, in a case of D0 bit=0, the channel 1 of the injector driver 11 is turned OFF. Conversely, in a case of D0 bit=1, the channel 1 of the injector driver 11 is turned ON.

Figure 4:
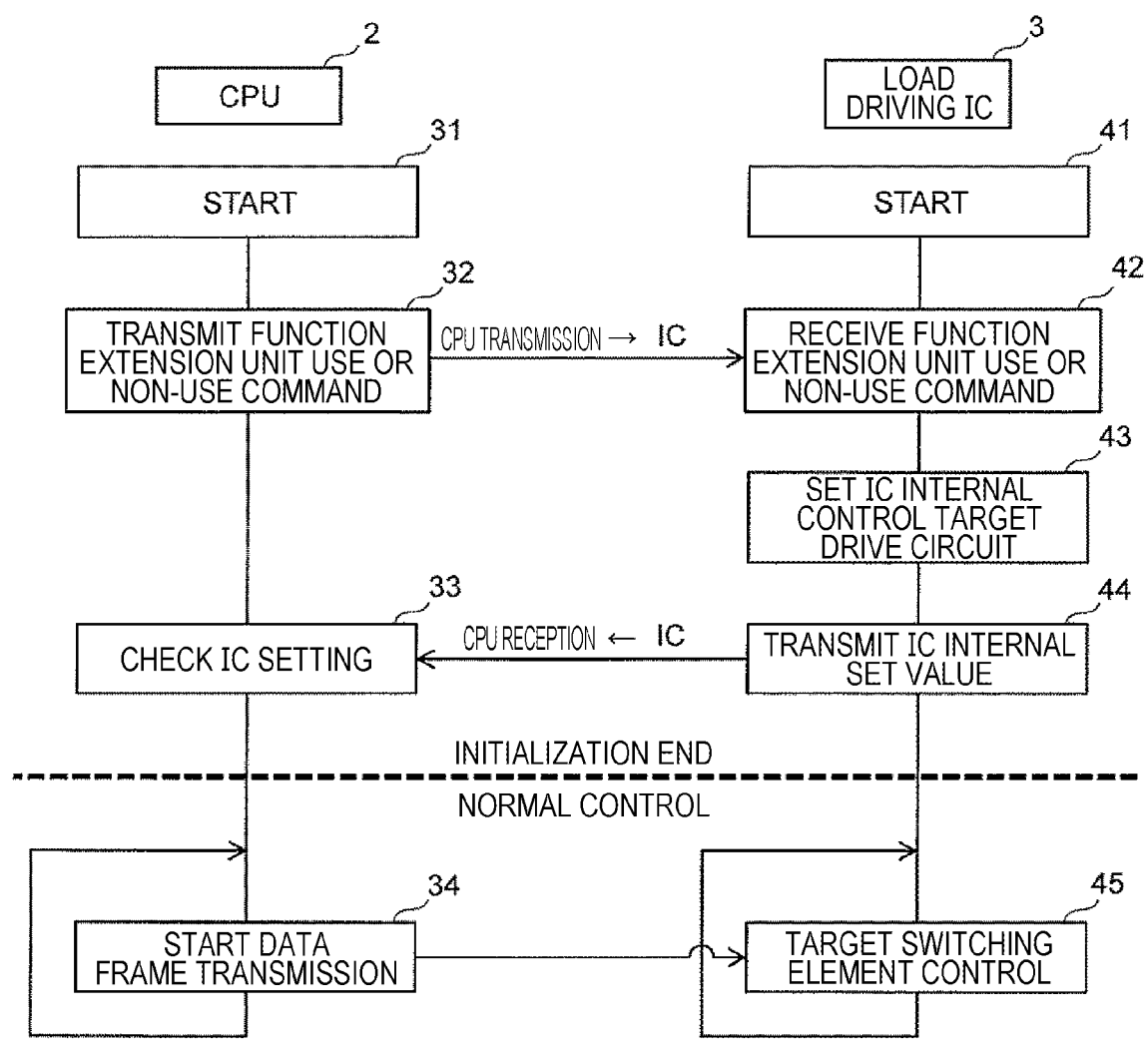
FIG. 4 is an initialization flowchart of a CPU and a load driving IC in the first embodiment.

FIG. 4 is an initialization flowchart for performing initialization setting of the load driving IC 3 from the CPU 2. By this initialization flow, it is possible to switch the data frame communication length together with the number of load driving circuits to be controlled by the load driving IC 3.

When the power supply of the ECU 1 is activated, the initialization flow is started (the CPU 2 starts from step 31 and the load driving IC 3 starts from step 41).

Next, the CPU 2 transmits a command frame indicating whether or not to use the flexible pre-driver 13 and the external switching element 14 to the load driving IC 3 via the communication circuit 4 (step 32). The load driving IC 3 receives the command frame via the communication circuit 5 (step 42).

The load driving IC 3 sets the driving circuit to be controlled inside the load driving IC 3 on the basis of the received command frame (step 43). For example, in a case of D5 bit=0 of D0 to D10 (25) at the address of C0 to C4 (24)=00001 in the command frame, the number of channels of the drive circuit is set such that the flexible pre-driver 13 and the external switching element 14 are not used. On the other hand, in a case of D5 bit=1 of D0 to D10 (25) at the same address, the number of channels of the drive circuit is set such that the flexible pre-driver 13 and the external switching element 14 are used. At this time, the load driving IC 3 also changes the data frame communication length according to the number of switching elements to be used. The load driving IC 3 stores information on the number of channels of the drive circuit to be controlled in the channel number storage unit 5*a*.

When switching of the number of drive circuit channels to be controlled and the data frame communication length in the load driving IC 3 is completed, the load driving IC 3 transmits the set value inside the IC to the CPU 2 (step 44).

The CPU 2 executes processing of checking the set value inside the IC on the basis of the received data (step 33). The CPU 2 checks whether the set value inside the load driving IC 3 matches the set value transmitted from the CPU 2.

Through the above processing, the load driving IC 3 can perform internal setting processing related to the number of channels on the basis of the data received from the CPU 2, and the CPU 2 can check the internal set value of the load driving IC 3 on the basis of the received data from the load driving IC 3. This processing is performed by initialization processing at the time of power supply activation so that it is possible to variably set a single load driving IC 3 for each vehicle model by a control program stored in a nonvolatile memory such as a flash memory in the CPU 2. Since the internal set value of the load driving IC 3 is configured to be held in a volatile register, there is a necessity of setting from the CPU 2 every time the power supply is activated, and until the software in the CPU 2 is executed, the versatility of the load driving IC 3 and the ECU 1 can be maintained.

Upon completion of the initialization flow, the CPU 2 and the load driving IC 3 transit to normal control. The CPU 2 changes the bit length of the data frame on the basis of received data from the load driving IC 3. The CPU 2 starts transmission of the data frame (step 34). The load driving IC 3 controls the target drivers 11, 12, 13 and the external switching element 14 on the basis of the received data frame (step 45).

Figure 5:
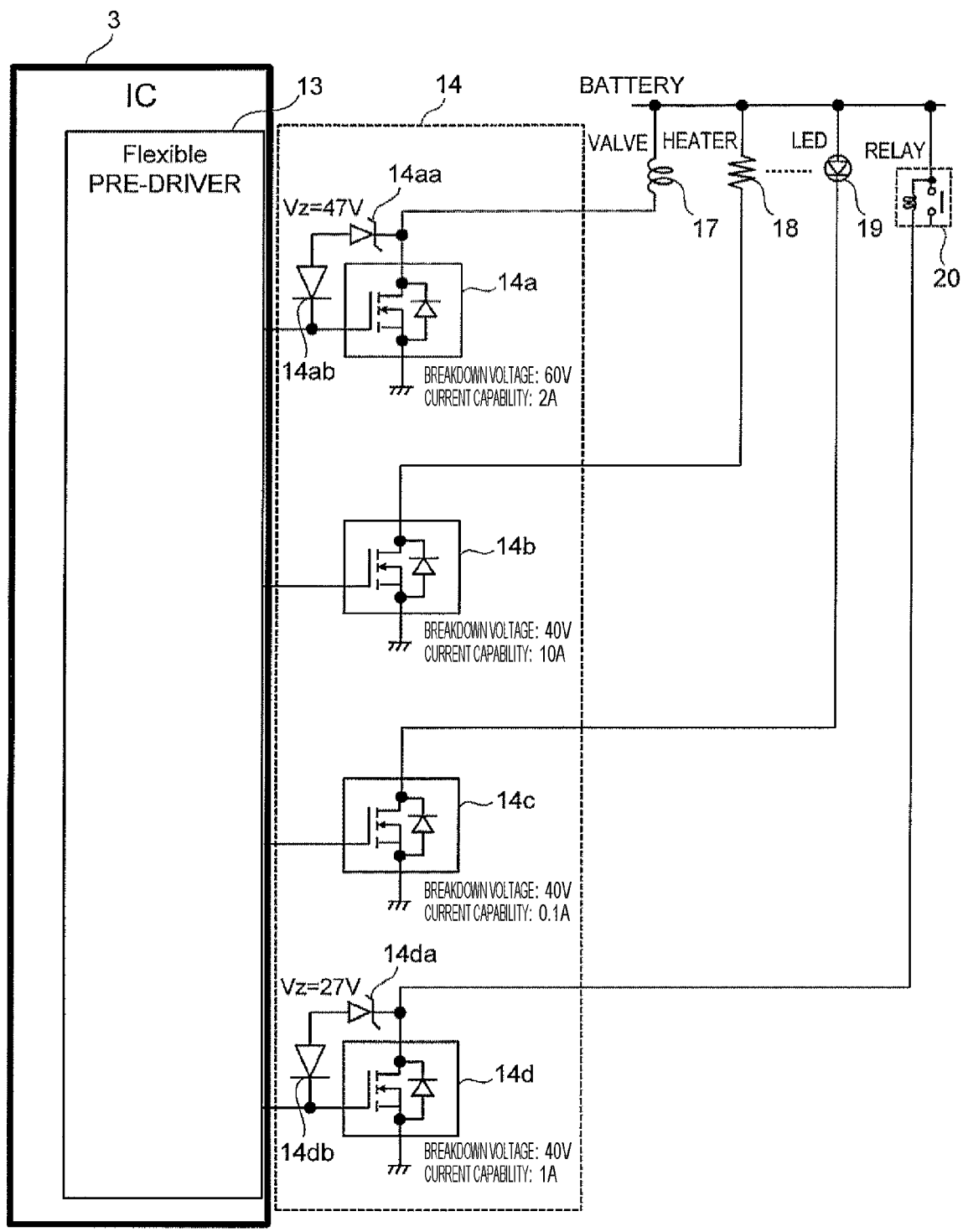
FIG. 5 is an example of a configuration of an external switching element of a function extension unit.

FIG. 5 shows an example of a configuration of the external switching element 14 of the function extension unit. The external switching element 14 includes a plurality of different switching elements according to the characteristics of the load to be controlled to drive. As an example, shown is a configuration example of the external switching elements 14*a* to 14*d* when controlling the valve 17, the heater resistor 18, the LED 19, and the relay 20 to drive.

The external switching element 14*a* includes a breakdown voltage protection circuit that limits a voltage to or below the breakdown voltage of the switching element. The external switching element 14*a* that controls the valve 17 to drive determines the clamp voltage by setting a Zener diode 14*aa* and a backflow prevention diode element 14*ab* between the drain and the gate of the external switching element 14*a*. Anodes of both the Zener diode 14*aa* and the backflow prevention diode element 14*ab* are connected, a cathode of the Zener diode 14*aa* is connected to the load (valve 17) side, and the cathode of the backflow prevention diode element 14*ab* is connected to a node for controlling the external switching element 14*a* from the flexible pre-driver 13. When the load of the valve 17 is driven, an allowable current value determined by the driving current of the valve 17 is set to 2 A, and since the valve 17 has an inductance component, the clamp voltage for determining the characteristic at the time of ON to OFF is set to 50 V (total value of the Zener diode 14*aa*: 47 V backflow prevention diode element 14*ab*: V gate ON voltage of 14*a*: 2 V). In this case, as the external switching element 14*a*, a MOSFET with a breakdown voltage of 60 V greater than 50 V and an allowable current of 2 A can be used.

When the load of the heater resistor 18 is driven, assuming that the allowable current value determined from the driving current of the heater resistor 18 is 10 A and the maximum value of the power supply battery voltage to which the heater resistor 18 is connected is 36 as the external switching element 14*b*, a switching element with a breakdown voltage value of 40 V equal to or larger than the maximum value described above can be used.

When the load of the LED 19 is driven, assuming that allowable current value determined from the driving current of the LED 19 is 0.1 A and the maximum value of the power supply battery voltage to which the LED 19 is connected is 36 V, as the external switching element 14*c*, a switching element with a breakdown voltage value of 40 V equal to or larger than the maximum value described above can be used.

When the load of the relay 20 is driven, an allowable current value determined by the driving current of the relay 20 is set to 1 A, and since the relay 20 has an inductance component, the clamp voltage for determining the characteristic at the time of ON to OFF is set to 30 V (total value of the Zener diode 14*da*: 27 V backflow prevention diode 14*db*: 1 V gate ON voltage of 14*d*: 2 V). In this case, as the external switching element 14*d*, a MOSFET with a breakdown voltage of 40 V greater than 30 V and an allowable current of 1 A can be used.

As shown in the present example, as the external switching elements 14*a* to 14*d*, the optimum MOSFET can be selected according to various loads, and the function can be easily optimized. In this example, the external switching element is described as a MOSFET. However, similar correspondence can be performed with various switching elements such as a bipolar transistor or IGBT.

Although the configuration of the low-side driver that pulls the current from the load is described in this example, the above-described embodiment can also be applied to the configuration of the high-side driver that supplies the current from the ECU to the load.

Figure 6:
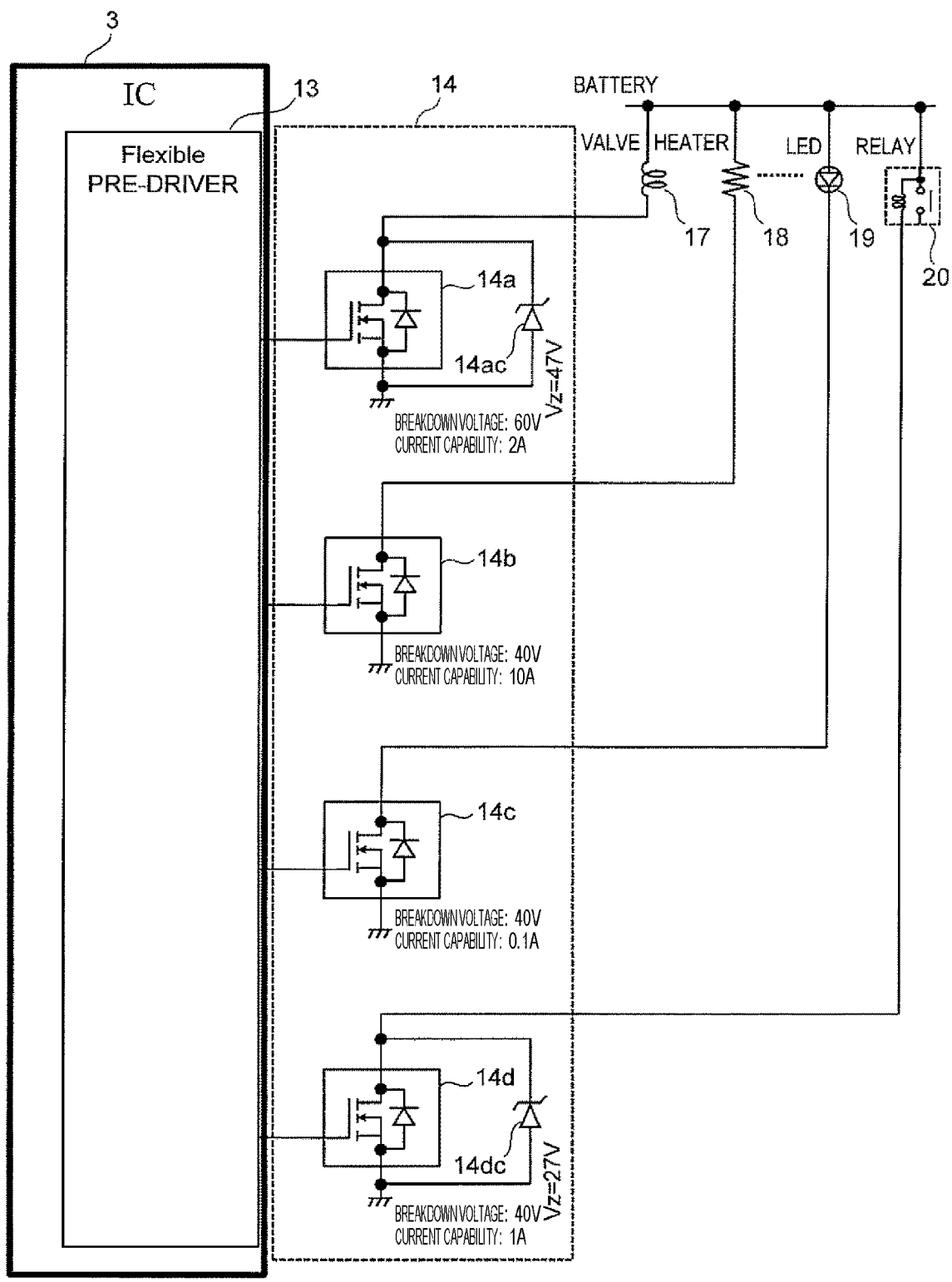
FIG. 6 is another example of a configuration of an external switching element of the function extension unit.

FIG. 6 is another example of a configuration of the external switching element of the function extension unit. In the example of FIG. 6, the external switching element 14*a* and the clamp circuit of the external switching element 14*d* are changed as compared with FIG. 5.

In FIG. 5, the external switching element 14*a* determines the clamp voltage by setting a Zener diode 14*aa* and a backflow prevention diode element 14*ab* between the drain and the gate of the external switching element 14*a*. On the other hand, in the example of FIG. 6, the Zener diode 14*ac* is set between the drain and the source of the external switching element 14*a*. The cathode of the Zener diode 14*ac* is connected to the upstream side of the external switching element 14a, and the anode of the Zener diode 14ac is connected to the downstream side of the external switching element 14a. As a result, the counter electromotive force generated at the time of ON to OFF by the inductance component of the valve 17 is absorbed by the Zener diode 14ac. The clamp voltage is determined by the characteristics of the Zener diode 14ac, which is 47 V in this example. Therefore, as similar to the example of FIG. 5, it is possible to use the external switching element 14a with a breakdown voltage of 60 V.

As described above, the Zener diode 14dc is set between the drain and the source of the external switching element 14d. As a result, the counter electromotive force generated at the time of ON to OFF by the inductance component of the relay 20 is absorbed by the Zener diode 14dc. The clamp voltage is determined by the characteristics of the Zener diode 14dc, which is 27 V in this example. Therefore, similar to the example of FIG. 5, it is possible to use the external switching element 14d with a breakdown voltage of 40 V.

The above-described ECU 1 includes the CPU 2 and the load driving IC 3, and the load driving IC 3 includes a first drive circuit (for example, the injector driver 11, the igniter pre-driver 12) that drives a first load (for example, the injector 15, the igniter 16), and a communication circuit 5 that transmits a control signal from the CPU 2 by serial communication. The load driving IC 3 further includes a second drive circuit (external switching element 14) for driving the second load (for example, the valve 17, the heater resistor 18, the LED 19, the relay 20). The second drive circuit is provided outside the load driving IC 3 separately from the first drive circuit. The load driving IC 3 includes a third drive circuit (flexible pre-driver 13) for controlling the second drive circuit. The CPU 2 transmits channel information corresponding to the number of switches of the second drive circuit to the load driving IC 3. The communication circuit 5 changes the number of channels (bit length) of the drive circuit to be controlled on the basis of the channel information from the CPU 2. According to this configuration, it is possible to improve versatility and function extensibility of the load driving IC 3.

Second Embodiment

The ECU 1 according to a second embodiment has a configuration in which the external switching element 14 is removed from the ECU 1 according to the first embodiment. With this configuration, in an ECU that does not require an extension function, the external switching element 14 is not mounted, so that mounting area reduction and cost optimization can be achieved. Since the load driving IC 3 does not incorporate the external switching element of the extension function, the size of the IC chip can be optimized, and both the extension function and cost optimization can be achieved.

Figure 7:
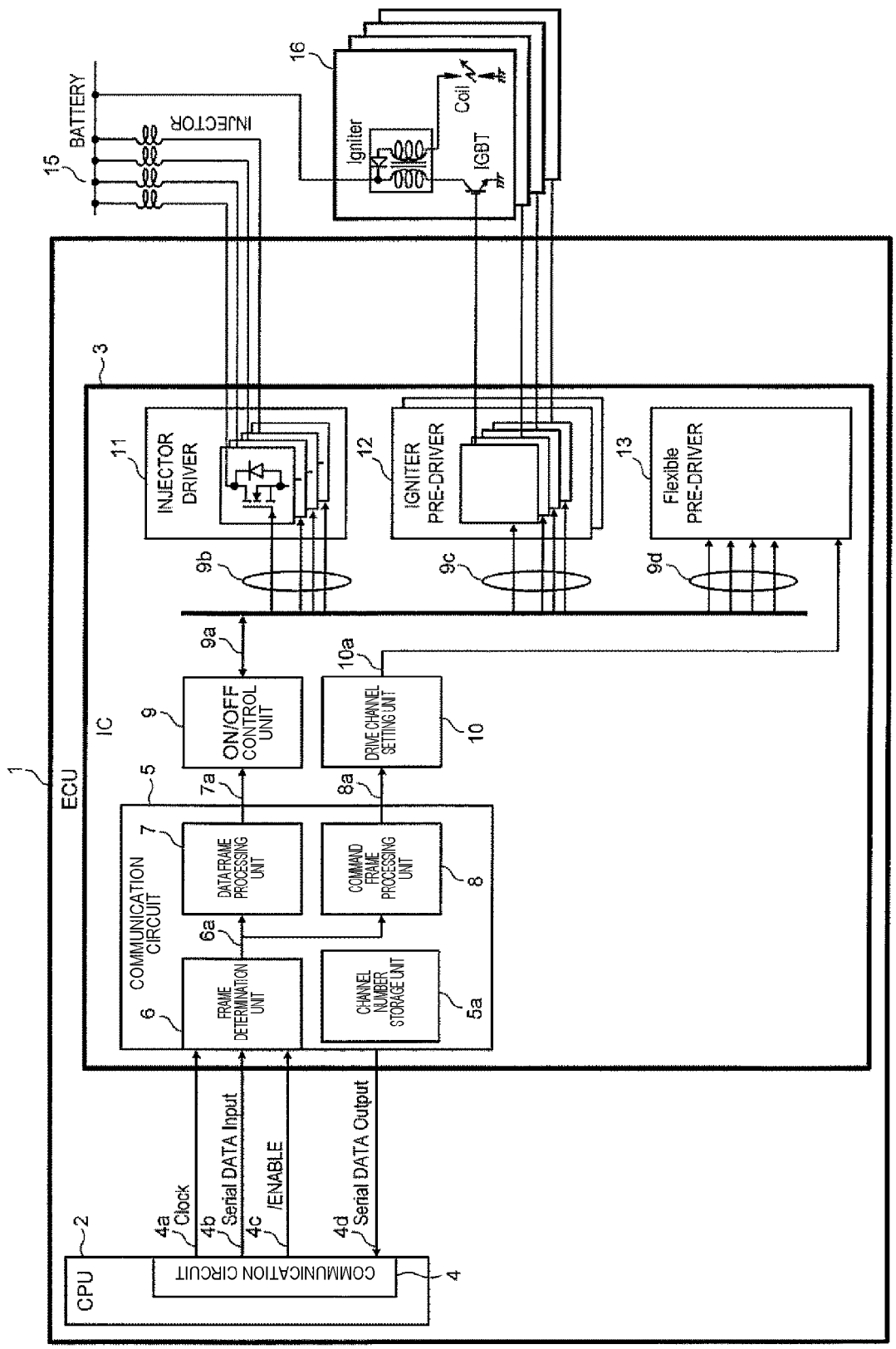
FIG. 7 is a configuration diagram of an engine control unit in a second embodiment.
Figure 8:
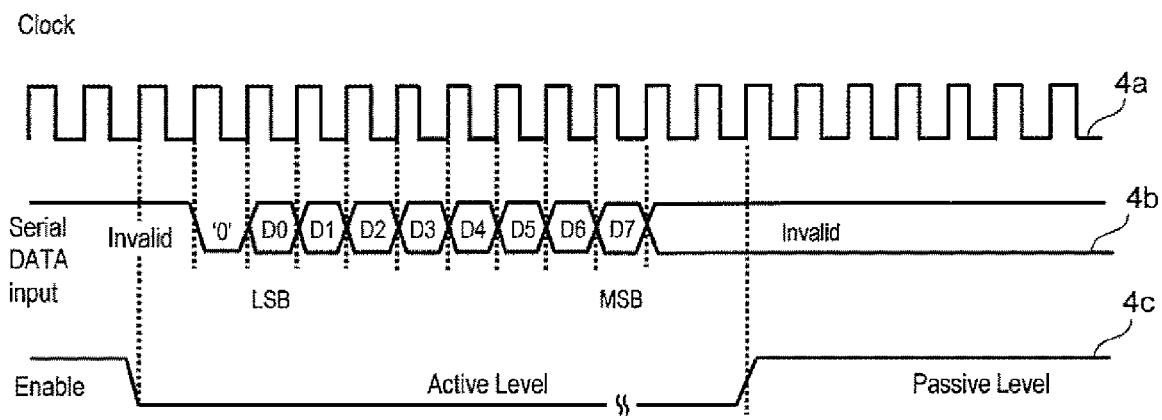
FIG. 8 is a diagram showing allocation of a data frame and a drive circuit in the second embodiment.

FIG. 7 is a configuration diagram of an engine control unit according to the second embodiment, and shows an ECU when the extension function of the load driving IC 3 is not used. FIG. 8 is a diagram showing allocation of a data frame and a drive circuit in the second embodiment, and is a diagram showing a data frame when the extension function of the load driving IC 3 is not used.

When the flexible pre-driver 13 and the external switching element 14 of the extension function are not used, the external switching element 14 is not mounted in the ECU 1. In this configuration, as an example, in a case of D5 bit=0 of D0-D10 (25) at the address of C0-C4 (24)=00001 in the command frame, bits D8 to D15 of the data frame for controlling the flexible pre-driver 13 to drive become unnecessary. Therefore, as shown in FIG. 8, the CPU 2 can control the load driving IC 3 by transmitting only the data frames of valid bits D0 to D7. D0 to D3 of the data frame are bits for controlling a channel 1 to a channel 4 of the injector driver 11 and D4 to D7 are bits for controlling a channel 1 to a channel 4 of the igniter pre-driver 12. ON/OFF of each load driving circuit can be controlled directly by bit information of each data frame. For each bit, for example, in a case of D0 bit=0, the channel 1 of the injector driver 11 is turned OFF. Conversely, in a case of D0 bit=1, the channel 1 of the injector driver 11 is turned ON.

Third Embodiment

In the ECU 1 according to the third embodiment, the external switching element 14 is removed from the ECU 1 according to the first embodiment and the ECU 1 is configured to drive the load 51 from the flexible pre-driver 13 of the load driving IC 3.

Figure 9:
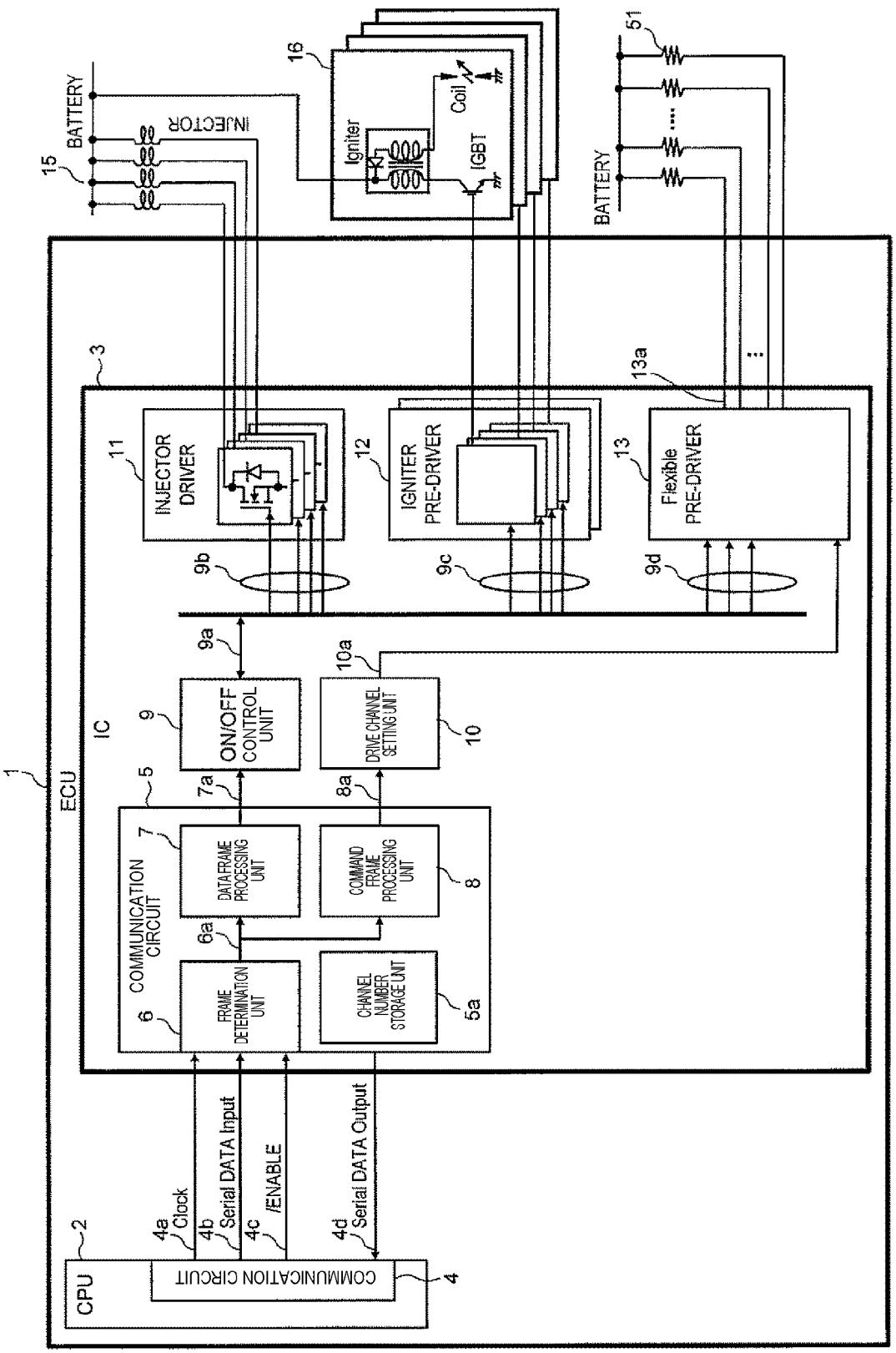
FIG. 9 is a configuration diagram of an engine control unit in a third embodiment.

FIG. 9 is a configuration diagram of an engine control unit according to the third embodiment. Since the flexible pre-driver 13 has the current capability of driving the load 51 which is the function extension unit, it is possible to directly drive the high-resistance load 51 with a small current. The CPU 2 transmits the control information of the flexible pre-driver 13 that controls the load 51 of the extension function to the load driving IC 3, and the communication circuit 5 controls the flexible pre-driver 13 on the basis of the control information. The present embodiment has versatility and extensibility that enables drive and control of a load that can be driven with a small current capability without setting of the external switching element 14. Also in the present embodiment, command frame and the data frame described in the first embodiment can be used.

The control device for driving the load is not limited to the engine control unit, but may be a transmission control unit, a brake control unit, or the like, for example.

The present invention is not limited to each of the embodiments described above, and various modifications are included. Each of the embodiments described above has been described in detail in order to explain the present invention in an easy-to-understand manner, and the present invention is not necessarily limited to those having all the configurations described in the embodiments. A part of the configuration of an embodiment can be replaced by the configuration of another embodiment. The configuration of another embodiment can be added to the configuration of an embodiment. With respect to part of the configuration of each embodiment, other configurations can be added, deleted, or replaced.

In the embodiments described above, control lines and information lines indicate what is considered to be necessary for explanation, and all control lines and information lines are not necessarily shown in the product. All the configurations may be mutually connected.

REFERENCE SIGNS LIST 1 engine control unit (ECU)
2 CPU
3 load driving IC
4 communication circuit with built-in CPU
5 communication circuit with built-in load driving IC
6 frame determination unit
7 data frame processing unit 8 command frame processing unit
9 ON/OFF control unit
10 drive channel setting unit
11 load driving switching element (injector driver)
12 load driving switching element (igniter pre-driver)
13 flexible pre-driver
14 external switching element
15 injector
16 igniter
17 valve
18 heater resistor
19 LED
20 relay

The invention claimed is:

1. A control device comprising a processor and an IC, wherein the IC comprises:
   a communication circuit that transmits a control signal from the processor by serial communication;
   a first drive circuit that drives a first load;
   a second drive circuit that drives a second load and is provided outside the IC separately from the first drive circuit; and
   a third drive circuit that controls the second drive circuit,
   the processor transmits channel information corresponding to the number of switches of the second drive circuit to the IC, and
   the communication circuit changes the number of channels of the third drive circuit on the basis of the channel information.

2. The control device according to claim 1,
   wherein the IC further comprises a channel number storage unit, and
   the communication circuit changes the number of channels when a power supply of the control device is activated and stores the changed number of channels in the channel number storage unit.

3. The control device according to claim 1,
   wherein the IC receives a command frame indicating whether or not to use the second drive circuit and the third drive circuit, and a data frame for controlling the third drive circuit from the processor.

4. The control device according to claim 3,
   wherein the IC identifies the command frame and the data frame by the first one bit of a signal received from the processor.

5. The control device according to claim 4,
   wherein the IC receives the command frame from the processor when a power supply of the control device is activated to change the number of channels, and
   the processor changes a bit length of the data frame according to the changed number of channels.

6. The control device according to claim 4,
   wherein the data frame further comprises data for controlling the first drive circuit.

7. The control device according to claim 1,
   wherein the second drive circuit comprises a plurality of different switching elements according to characteristics of the second load.

8. The control device according to claim 7,
   wherein the switching element is one of a MOSFET, a bipolar transistor, or an IGBT.

9. The control device according to claim 7,
   wherein the switching element comprises a breakdown voltage protection circuit for limiting a voltage equal to or smaller than a breakdown voltage of the switching element, the breakdown voltage protection circuit comprises a Zener diode and a diode,
   anodes of both the Zener diode and the diode are connected, a cathode of the Zener diode is connected to the second load side, and a cathode of the diode is connected to a node for controlling the second drive circuit from the third drive circuit.

10. The control device according to claim 7,
    wherein the switching element comprises a Zener diode, and
    the switching element comprises a breakdown voltage protection circuit in which a cathode of the Zener diode is connected to an upstream side of the switching element and an anode of the Zener diode is connected to a downstream side of the switching element.

11. The control device according to claim 1,
    wherein the second drive circuit controls an engine auxiliary machine to drive.

* * * * *